(12) United States Patent
Aoike et al.

(10) Patent No.: US 10,157,812 B2
(45) Date of Patent: Dec. 18, 2018

(54) SEMICONDUCTOR DEVICE AND METHOD OF MANUFACTURING THE SAME

(71) Applicant: Murata Manufacturing Co., Ltd., Kyoto (JP)

(72) Inventors: Masayuki Aoike, Kyoto (JP); Atsushi Kurokawa, Kyoto (JP); Atsushi Kobayashi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/784,667

(22) Filed: Oct. 16, 2017

(65) Prior Publication Data

US 2018/0108589 A1   Apr. 19, 2018

(30) Foreign Application Priority Data

Oct. 19, 2016   (JP) .................................. 2016-205227

(51) Int. Cl.
| | |
|---|---|
| *H01L 23/31* | (2006.01) |
| *H01L 21/56* | (2006.01) |
| *H01L 23/29* | (2006.01) |
| *H01L 21/02* | (2006.01) |
| *H01L 21/285* | (2006.01) |
| *H01L 21/288* | (2006.01) |

(52) U.S. Cl.
CPC .... *H01L 23/3192* (2013.01); *H01L 21/02274* (2013.01); *H01L 21/56* (2013.01); *H01L 23/291* (2013.01); *H01L 23/3171* (2013.01); *H01L 21/0214* (2013.01); *H01L 21/0217* (2013.01); *H01L 21/02164* (2013.01); *H01L 21/288* (2013.01); *H01L 21/2855* (2013.01); *H01L 21/28556* (2013.01)

(58) Field of Classification Search
CPC ................. H01L 29/93; H01L 27/0229; H01L 27/10823; H01L 21/82; H01L 23/3171
See application file for complete search history.

(56) References Cited

U.S. PATENT DOCUMENTS

| | | | |
|---|---|---|---|
| 5,523,616 A | 6/1996 | Den | |
| 7,585,704 B2 * | 9/2009 | Belyansky | ............ C23C 16/345 438/131 |
| 2014/0284729 A1 | 9/2014 | Obara et al. | |

FOREIGN PATENT DOCUMENTS

| | | |
|---|---|---|
| JP | H07-130131 A | 5/1995 |
| TW | 201438072 A1 | 10/2014 |

* cited by examiner

*Primary Examiner* — Quoc Hoang
(74) *Attorney, Agent, or Firm* — Pearne & Gordon LLP

(57) ABSTRACT

A semiconductor device includes a semiconductor substrate, a semiconductor element formed in or on the semiconductor substrate, a metal layer connected to the semiconductor element, and a passivation film that protects the semiconductor element. The passivation film is formed by alternately stacking a first insulation film that generates compressive stress and has low density and a second insulation film that generates compressive stress and has high density. The first insulation film is disposed in a lowest layer of the passivation film, the lowest layer being nearest to the semiconductor substrate. Each of the first insulation film and the second insulation film is one of a silicon nitride film, a silicon oxide film, and a silicon oxynitride film.

4 Claims, 12 Drawing Sheets

SEMICONDUCTOR DEVICE AND METHOD OF MANUFACTURING THE SAME

This application claims priority from Japanese Patent Application No. 2016-205227 filed on Oct. 19, 2016. The content of this application is incorporated herein by reference in its entirety.

BACKGROUND OF THE DISCLOSURE

1. Field of the Disclosure

The present disclosure relates to a semiconductor device in which a passivation film is formed on or over a semiconductor substrate and a method of manufacturing the semiconductor device.

2. Description of the Related Art

Semiconductor devices including a semiconductor substrate, a semiconductor element formed in or on the semiconductor substrate, and a passivation film that protects the semiconductor element are generally known (see, for example, Japanese Unexamined Patent Application Publication No. 7-130731). Japanese Unexamined Patent Application Publication No. 7-130731 describes a structure in which a passivation film is formed by alternately stacking two types of compressive stress films having different densities.

A passivation film is a protective film formed on or over a surface of a device, and the passivation film is formed in the final step of a wafer process. Therefore, on a wafer surface on which a passivation film is to be formed, for example, a semiconductor layer, an insulation layer, an organic layer, and a metal layer have been formed. That is, the wafer surface has the process history accumulated before the passivation film is formed. The wafer tends to have residual compressive stress due to the differences in the thermal expansion coefficient between various materials.

In the passivation film described in Japanese Unexamined Patent Application Publication No. 7-130731, a compressive stress film having high density is disposed in the lowest layer. In general, a compressive stress film having high density tends to have compressive stress larger than that of a compressive stress film having low density. The compressive stress due to the compressive stress film having high density is added to the residual compressive stress of the wafer. As a result, a problem arises in that the wafer may warp and the passivation film may crack due to these compressive stresses.

BRIEF SUMMARY OF THE DISCLOSURE

An object of the present disclosure, which has been devised to solve the problem of existing technology, is to provide a semiconductor device that can reduce the warping of a wafer and forming of a crack in a passivation film and a method of manufacturing the semiconductor device.

According to preferred embodiments of the present disclosure, a semiconductor device includes a semiconductor substrate, a semiconductor element formed in or on the semiconductor substrate, and a passivation film that protects the semiconductor element. The passivation film is formed by alternately stacking a first insulation film that generates compressive stress and has low density and a second insulation film that generates compressive stress and has high density. The first insulation film is disposed in a lowest layer of the passivation film, the lowest layer being nearest to the semiconductor substrate.

With the structure described above, even when compressive stress due to the process history is generated in the semiconductor substrate, the first insulation film, having low density, can alleviate the compressive stress of the semiconductor substrate. As a result, the warping of a wafer including the semiconductor substrate and the generation of a crack in the passivation film can be reduced.

In the semiconductor device, each of the first insulation film and the second insulation film may be one of a silicon nitride film, a silicon oxide film, and a silicon oxynitride film.

In this case, since the passivation film is formed by stacking the first insulation film and the second insulation film, the passivation film can have insulating property and moisture resistance.

In the semiconductor device, a semiconductor layer, an insulation layer, an organic layer, and a metal layer may be formed on or over the semiconductor substrate, and the passivation film may be formed on or over the semiconductor substrate so as to cover the semiconductor layer, the insulation layer, the organic layer, and the metal layer.

In this case, even when the semiconductor layer, the insulation layer, the organic layer, and the metal layer generate compressive stresses due to the differences in the thermal expansion coefficient therebetween, the first insulation film, having low density, can alleviate the compressive stresses.

According preferred embodiment of the present disclosure, a method of manufacturing a semiconductor device includes a step of forming a passivation film on or over a semiconductor substrate by alternately stacking a first insulation film that generates compressive stress and has low density and a second insulation film that generates compressive stress and has high density. In the step of forming the passivation film, the first insulation film is disposed in the lowest layer of the passivation film, the lowest layer being nearest to the semiconductor substrate.

With the structure described above, even when compressive stress due to the process history is generated in the semiconductor substrate, the first insulation film, having low density, can alleviate the compressive stress of the semiconductor substrate. As a result, the warping of a wafer including the semiconductor substrate and the generation of a crack in the passivation film can be reduced.

The method may further include a step of forming a semiconductor layer, an insulation layer, an organic layer, and a metal layer on or over the semiconductor substrate, the step being performed before the step of forming the passivation film; and, in the step of forming the passivation film, the passivation film may be formed on or over the semiconductor substrate so as to cover the semiconductor layer, the insulation layer, the organic layer, and the metal layer.

In this case, even when the semiconductor layer, the insulation layer, the organic layer, and the metal layer generate compressive stresses due to the differences in the thermal expansion coefficient therebetween, the first insulation film, having low density, can alleviate the compressive stresses.

In the method, the metal layer may be formed by vapor deposition or plating.

In this case, even when compressive stress is generated in the metal layer while the metal layer is being formed, the first insulation film, having low density, can alleviate the compressive stress of the metal layer.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Hereinafter, semiconductor devices according to embodiments of the present disclosure will be described with reference to the drawings. Each of the semiconductor devices can be used, for example, as an electric power amplifier that amplifies a high-frequency signal having a frequency in, for example, a megahertz band or a gigahertz band.

Figure 1:
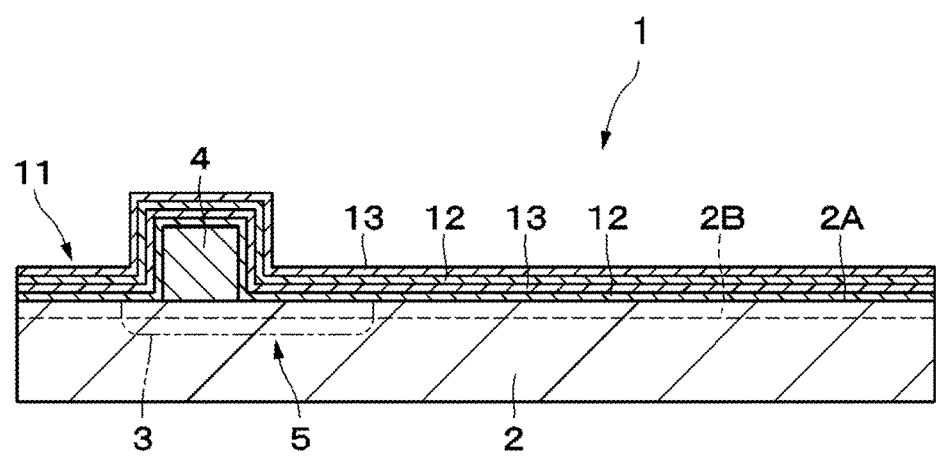
FIG. 1 is a sectional view of a semiconductor device according to a first embodiment.

FIG. 1 illustrates a semiconductor device 1 according to a first embodiment. The semiconductor device 1 includes a semiconductor substrate 2, a metal layer 4, and a passivation film 11.

The semiconductor substrate 2 is a planar substrate made of a semiconductor material, such as gallium arsenide (GaAs). The semiconductor substrate 2 may be made of another group III-V compound semiconductor, such as indium phosphide (InP) or gallium nitride (GaN). The semiconductor substrate 2 may be made of a group II-VI compound semiconductor, such as zinc selenide (ZnSe), or a group IV compound semiconductor, such as silicon carbide (SiC) or silicon germanium (SiGe). Instead of a compound semiconductor, the semiconductor substrate 2 may be made of a group IV single element semiconductor, such as silicon (Si) or germanium (Ge).

A semiconductor layer 2B, which is made of gallium arsenide (GaAs), aluminium gallium arsenide (AlGaAs), or the like, is formed on a surface 2A of the semiconductor substrate 2. The semiconductor layer 2B may or may not be doped with impurities. The semiconductor layer 2B may consist of one layer or a plurality of layers (for example, two layers).

A semiconductor element 3 is disposed in or on the semiconductor substrate 2 at a position near the surface 2A.

For example, the semiconductor element 3 is formed so as to include a part of the semiconductor layer 2B. The semiconductor element 3 may be an active element, such as a diode or a field-effect transistor, or a passive element, such as a resistor or a capacitor. In general, a plurality of semiconductor elements 3 are disposed in or on the semiconductor substrate 2 (although only one of them is shown in the figures). The plurality of semiconductor elements 3 are electrically connected to each other through the metal layer 4.

The metal layer 4 is formed on the surface 2A of the semiconductor substrate 2. The metal layer 4 is made of an electrically conductive metal material, such as gold (Au). The metal layer 4 has various functions, such as a function of forming electrodes of the semiconductor element 3, a function of electrically connecting a plurality of semiconductor elements 3 to each other, and a function of electrically connecting the semiconductor element 3 to the outside. As a result, a circuit 5 (such as an amplifier circuit) including the semiconductor elements 3 is formed in or on the semiconductor substrate 2. Therefore, the semiconductor substrate 2 is a circuit substrate in which the circuit 5 is formed.

The passivation film 11 is disposed on or over the surface 2A of the semiconductor substrate 2 so as to cover the metal layer 4. Therefore, the passivation film 11 covers not only the metal layer 4 but also the semiconductor layer 2B. The passivation film 11 is formed by alternately stacking a first insulation film 12 that generates compressive stress and has low density and a second insulation film 13 that generates compressive stress and has high density. The first insulation film 12 is disposed in the lowest layer that is nearest to the semiconductor substrate 2.

Each of the first insulation film 12 and the second insulation film 13 is, for example, a silicon nitride film. The first insulation film 12 and the second insulation film 13 are made by using a film forming method, such as plasma vapor deposition (plasma CVD). The first insulation film 12 and the second insulation film 13 are formed under different film forming conditions (growth conditions). For example, the first insulation film 12 and the second insulation film 13 are formed by supplying different amounts of high frequency electric power (RF power) to a discharge electrode of a plasma CVD device. To be specific, the second insulation film 13 is formed by using a larger amount of high frequency electric power than the first insulation film 12. Thus, the second insulation film 13 is a silicon nitride film that has a higher density than the first insulation film 12. As a result, the second insulation film 13 is more resistant to moisture than the first insulation film 12.

In addition, since the second insulation film 13 is a silicon nitride film having a higher density than the first insulation film 12, the compressive stress of the second insulation film 13 is larger than that of the first insulation film 12. The film forming conditions and the like are appropriately set so that each of the first insulation film 12 and the second insulation film 13 generates compressive stress. Therefore, each of the first insulation film 12 and the second insulation film 13 is a compressive stress film that generates compressive stress.

The compressive stress of the first insulation film 12 is smaller than that of the second insulation film 13. Preferably, the compressive stress of the first insulation film 12 is smaller than compressive stress generated in the semiconductor substrate 2.

The passivation film 11 is formed by alternately stacking the first insulation film 12 and the second insulation film 13. The passivation film 11 may consist of two insulation films, which are one first insulation film 12 and one second insulation film 13 that are stacked, or three or more insulation films. That is, the number of first insulation films 12 and the number of second insulation films 13 may be the same as or different from each other. FIG. 1 illustrates an example in which the passivation film 11 includes two first insulation films 12 and two second insulation films 13.

It is not necessary that the first insulation film 12 and the second insulation film 13 are made of the same material. The first insulation film 12 and the second insulation film 13 may be made of different materials. In consideration of moisture resistance and stability, preferably, each of the first insulation film 12 and the second insulation film 13 is one of a silicon nitride (such as $Si_3N_4$ or SiN) film, a silicon oxide (such as $SiO_2$ or SiO) film, and a silicon oxynitride (such as SiON) film.

Figure 2:
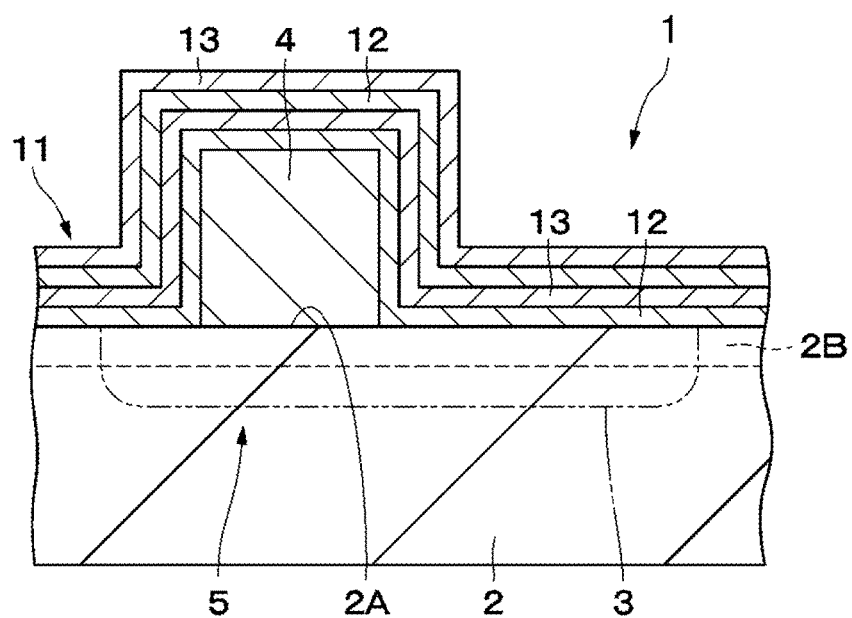
FIG. 2 is a partial enlarged sectional view of the semiconductor device according to the first embodiment.
Figure 3:
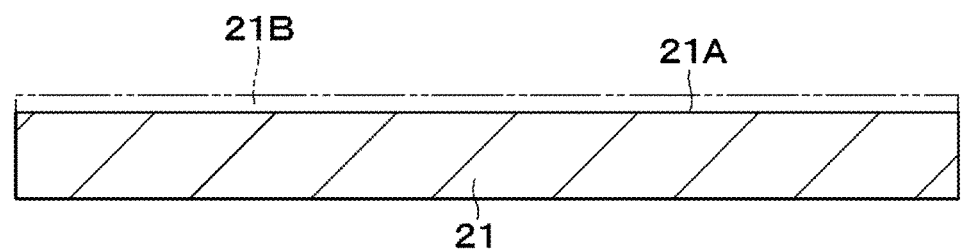
FIG. 3 is a sectional view illustrating a semiconductor layer forming step.

Referring to FIGS. 1 to 4, a method for manufacturing the semiconductor device 1 will be described. In a general manufacturing method, a plurality of semiconductor devices 1 are simultaneously made in a single wafer. Then, in the final step (separation step) after the passivation film 11 has been formed, individual semiconductor chips are separated from the wafer. Thus, the semiconductor device 1 illustrated in FIGS. 1 and 2 is formed. The separation step of separating the semiconductor chips from a wafer will not be described here.

First, an unprocessed semiconductor substrate 21 made of a compound semiconductor, such as gallium arsenide, is prepared. Next, in a semiconductor layer forming step illustrated in FIG. 3, a semiconductor layer 21B is formed on a surface 21A of the semiconductor substrate 21 by using a film forming method such as plasma CVD. Thus, the semiconductor substrate 2 is formed.

Figure 4:
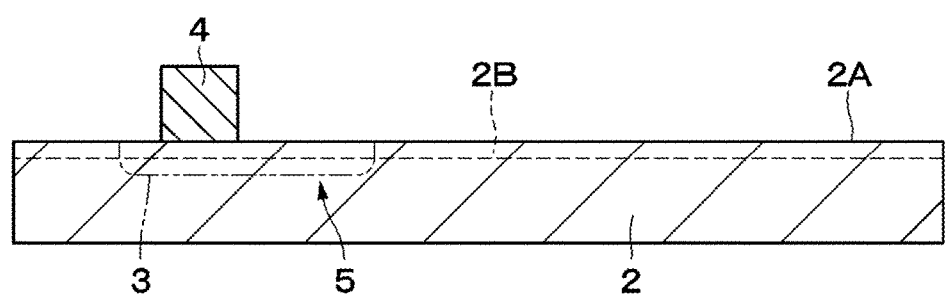
FIG. 4 is a sectional view illustrating a metal layer forming step.

Next, in a metal layer forming step illustrated in FIG. 4, a metal film of an electrically conductive metal material is formed on the surface 2A of the semiconductor substrate 2 by using a film forming method such as vacuum deposition, sputtering, or plating. Subsequently, unnecessary parts of the metal film are removed by etching or the like. Thus, the metal layer 4, which functions as electrodes, connection wiring, and the like, is formed on the surface 2A of the semiconductor substrate 2. As the metal layer 4 is formed, the semiconductor element 3 and the circuit 5 are formed in or on the semiconductor substrate 2.

Next, in a passivation film forming step, the passivation film 11, which includes the first insulation film 12 and the second insulation film 13, is formed on the surface 2A of the semiconductor substrate 2 by using a film forming method such as plasma CVD. In this step, the first insulation film 12 which generates compressive stress and has low density, and the second insulation film 13 which generates compressive stress and has high density, are grown so as to be alternately stacked.

To be specific, first, the first insulation film 12, which is the first layer (the lowest layer), is formed on a junction surface of the semiconductor substrate 2. Next, the second insulation film 13, which is the second layer, is formed so as to cover the first insulation film 12, which is the first layer. Next, the first insulation film 12, which is the third layer, is formed so as to cover the second insulation film 13, which is the second layer. Lastly, the second insulation film 13, which is the fourth layer, is formed so as to cover the first insulation film 12, which is the third layer.

In this step, the first insulation film 12 and the second insulation film 13 are formed under different film forming conditions, such as high frequency electric power. Thus, the compressive stress of the first insulation film 12 is smaller than that of the second insulation film 13.

The metal layer 4 is formed on the surface 2A of the semiconductor substrate 2. When forming the metal layer 4, temperature changes due to heating, cooling, or the like. The thermal expansion coefficients of the metal layer 4 and the like and the semiconductor substrate 2 differ from each other. Therefore, internal stress is generated in a portion of the semiconductor substrate 2 near the surface 2A due to the difference in the thermal expansion coefficient. Moreover, internal stress tends to be generated also in the semiconductor layer 2B of the semiconductor substrate 2. Thus, compressive stress tends to be generated in the semiconductor substrate 2 due to the manufacturing process history. In addition, the metal layer 4 has a quadrangular cross section. Therefore, stress tends to concentrate in the corner portions of the metal layer 4, and deformation or strain tends to occur in a portion of the passivation film 11 that is in contact with the metal layer 4.

However, the passivation film 11 includes the first insulation film 12 and the second insulation film 13; and the first insulation film 12, which has low density, is disposed in the lowest layer that is nearest to the semiconductor substrate 2. Therefore, even when compressive stress due to the process history is generated in the semiconductor substrate 2, the first insulation film 12, having small compressive stress, can alleviate the compressive stress of the semiconductor substrate 2. As a result, the warping of a wafer including the semiconductor substrate 2 and generation of a crack in the passivation film 11 can be reduced.

Thus, with the first embodiment, the passivation film 11 is formed by alternately stacking the first insulation film 12, which generates compressive stress and has low density, and the second insulation film 13, which generates compressive stress and has high density; and the first insulation film 12 is disposed in the lowest layer that is nearest to the semiconductor substrate 2. Therefore, even when compressive stress due to the process history is generated in the semiconductor substrate 2, the first insulation film 12, having low density, can alleviate the compressive stress of the semiconductor substrate 2. As a result, the warping of a wafer including the semiconductor substrate 2 and generation of a crack in the passivation film 11 can be reduced.

Moreover, each of the first insulation film 12 and the second insulation film 13 is one of a silicon nitride film, a silicon oxide film, and a silicon oxynitride film. Since the passivation film 11 is formed by stacking the first insulation film 12 and the second insulation film 13, the passivation film 11 can have insulating property and moisture resistance.

Since the metal layer 4 is made by vapor deposition or plating, compressive stress tends to be generated in the metal layer 4 while the metal layer 4 is being formed. Moreover, stress tends to concentrate in the corner portions of the metal layer 4, which has a quadrangular cross-sectional shape. However, the passivation film 11 is formed by stacking the first insulation film 12 and the second insulation film 13; and the first insulation film 12, which has low density, is disposed in the lowest layer that is in contact with the metal layer 4. Therefore, the first insulation film 12, having low density, can alleviate the compressive stress of the metal layer 4. In addition, deformation of the passivation film 11 is suppressed, and generation of a crack in the passivation film 11 can be reduced.

Figure 5:
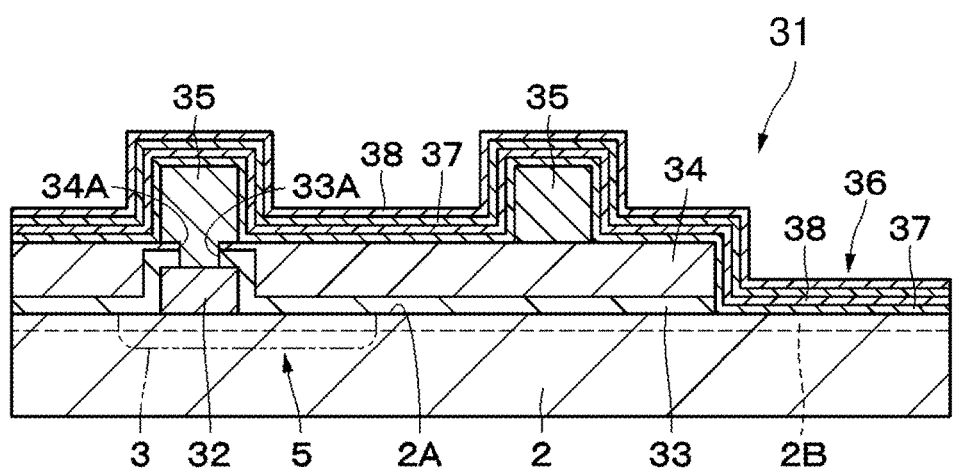
FIG. 5 is a sectional view of a semiconductor device according to a second embodiment.
Figure 6:
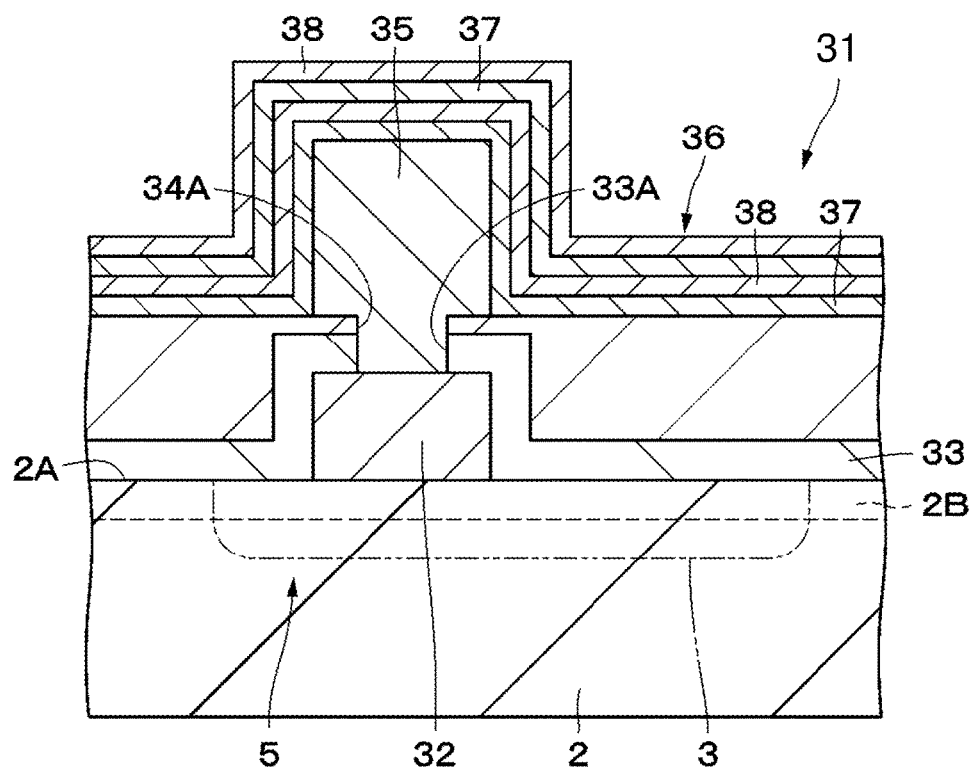
FIG. 6 is a partial enlarged sectional view of the semiconductor device according to the second embodiment.

FIGS. 5 and 6 illustrate a semiconductor device 31 according to a second embodiment of the present disclosure. The semiconductor device 31 is characterized in that a first metal layer 32, an insulation layer 33, an organic layer 34, and a second metal layer 35 are formed on or over a surface 2A of a semiconductor substrate 2; and a passivation film 36 is formed so as to cover these layers. In the following description, elements of the semiconductor device 31 that are the same as those of the semiconductor device 1 according to the first embodiment will be denoted by the same numerals and descriptions of such elements will be omitted.

The semiconductor device 31 includes the semiconductor substrate 2, the first metal layer 32, the insulation layer 33, the organic layer 34, the second metal layer 35, and the passivation film 36. A semiconductor layer 2B is formed on the surface 2A of the semiconductor substrate 2.

The first metal layer 32, which is a metal layer adjacent to the semiconductor substrate 2, is formed on the surface 2A of the semiconductor substrate 2. The first metal layer 32 is made of, for example, an electrically conductive metal material. The first metal layer 32 has various functions, such as a function of forming electrodes of a semiconductor element 3 and a function of electrically connecting a plurality of semiconductor elements 3 to each other. As a result, a circuit 5, including the semiconductor element 3, is formed in or on the semiconductor substrate 2.

The insulation layer 33 is formed on the surface 2A of the semiconductor substrate 2 so as to cover the semiconductor element 3. The insulation layer 33 is made of an insulating inorganic material, such as silicon nitride. A via 33A which is a through-hole is formed in the insulation layer 33, for example, at a position corresponding to the position of the first metal layer 32. The insulation layer 33 is an interlayer insulating layer that electrically insulates the surface 2A of the semiconductor substrate 2 and the second metal layer 35 from each other.

The organic layer 34 is formed over the semiconductor substrate 2 so as to cover the insulation layer 33. The organic layer 34 is an interlayer insulating layer as with the insulation layer 33. The organic layer 34 is made of an insulating organic material, such as polyimide resin (PI), benzocyclobutene (BCB), polybenzoxazole (PBO), or the like. The organic layer 34 tends to have a larger thickness than the insulation layer 33. The organic layer 34 has a function of, for example, flattening the entirety of the surface of the semiconductor device 31 and a function of reducing the interlayer capacitance between the first metal layer 32 and the second metal layer 35. A via 34A which is a through-hole is formed in the organic layer 34 at a position corresponding to the position of the first metal layer 32. The via 34A is disposed at a position corresponding to the position of the via 33A. Therefore, the surface of the first metal layer 32 is exposed in the via 34A. It is not necessary that the vias 33A and 34A have the same size (same opening area). The sizes of the vias 33A and 34A may differ from each other. For example, the via 34A of the organic layer 34 may be larger than the via 33A of the insulation layer 33.

The second metal layer 35 is a metal layer that is not in contact with the semiconductor substrate 2. The second metal layer 35 is located on the surface of the organic layer 34 and formed over the semiconductor substrate 2. The second metal layer 35 is made of, for example, an electrically conductive metal material. The second metal layer 35 have various functions, such as a function of electrically connecting the semiconductor element 3 to the outside with the first metal layer 32 therebetween. Therefore, the second metal layer 35 is electrically connected to the first metal layer 32 through the vias 33A and 34A.

The passivation film 36 is disposed on or over the semiconductor substrate 2 so as to cover the second metal layer 35. Therefore, the passivation film 36 covers not only the second metal layer 35 but also the organic layer 34, the semiconductor layer 2B, and the like. The passivation film 36 is structured in substantially the same way as the passivation film 11 according to the first embodiment. Therefore, the passivation film 36 is formed by alternately stacking a first insulation film 37 that generates compressive stress and has low density and a second insulation film 38 that generates compressive stress and has high density. In addition, the first insulation film 37 is disposed in a lowest layer that is nearest to the semiconductor substrate 2. The first insulation film 37 is structured in substantially the same way as the first insulation film 12 according to the first embodiment. Therefore, the first insulation film 37 is a compressive stress film having low density. The second insulation film 38 is structured in substantially the same way as the second insulation film 13 according to the first embodiment. Therefore, the second insulation film 38 is a compressive stress film having high density.

Referring to FIGS. 5 to 12, a method for manufacturing the semiconductor device 31 will be described. In a general manufacturing method, in the final step (separation step) after the passivation film 36 has been formed, individual semiconductor chips are separated from a wafer. Thus, the semiconductor device 31 illustrated in FIGS. 5 and 6 is formed. The separation step of separating semiconductor chips from a wafer will not be described here.

First, an unprocessed semiconductor substrate made of a compound semiconductor, such as gallium arsenide, is prepared. Next, a semiconductor layer is formed on the surface of the semiconductor substrate by using a film forming method such as plasma CVD. Thus, the semiconductor substrate 2 is formed. These steps are substantially the same as the semiconductor film forming steps according the first embodiment shown in FIG. 3.

Figure 7:
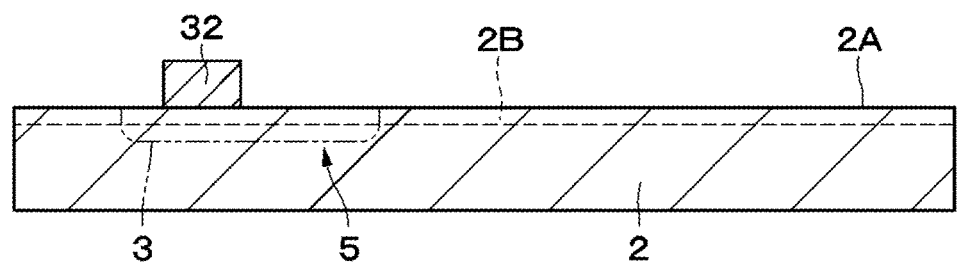
FIG. 7 is a sectional view illustrating a first metal layer forming step.

Next, in a first metal layer forming step illustrated in FIG. 7, a metal film of an electrically conductive metal material is formed on the surface 2A of the semiconductor substrate 2 by using a film forming method such as vacuum deposition, sputtering, or plating. Subsequently, unnecessary parts of the metal film are removed by etching or the like. Thus, the first metal layer 32, which functions as electrodes, connection wiring, and the like, is formed on the surface 2A of the semiconductor substrate 2. Accordingly, the semiconductor element 3 and the circuit 5 are formed in or on the semiconductor substrate 2.

Figure 8:
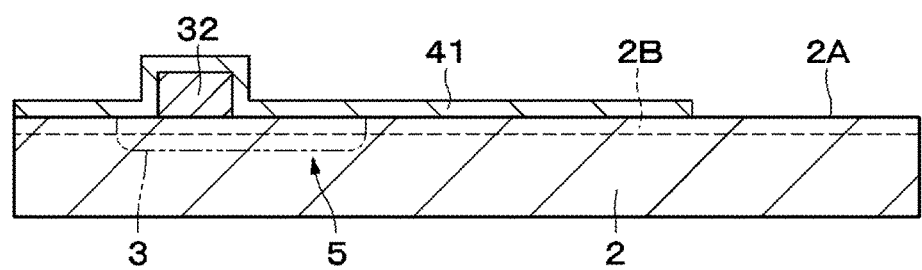
FIG. 8 is a sectional view illustrating an insulation layer forming step.

Next, in an insulation layer forming step illustrated in FIG. 8, an insulation film 41 of an insulating inorganic material film, such as silicon nitride, is formed on the surface 2A of the semiconductor substrate 2 by using a film forming method such as plasma CVD. In this step, the insulation film 41 is formed so as to cover the entirety of the surface 2A of the semiconductor substrate 2.

Figure 9:
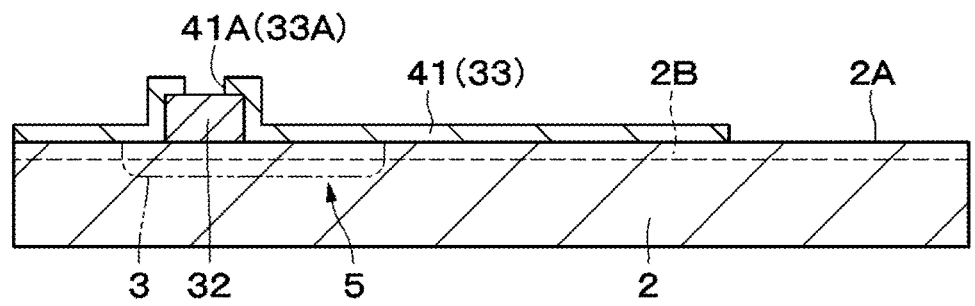
FIG. 9 is a sectional view illustrating a first via forming step.

Next, in a first via forming step illustrated in FIG. 9, etching is performed in a state in which, for example, necessary parts are masked by using photoresist or the like, and thereby a via 41A, which is a though-hole, is formed in the insulation film 41. Thus, the insulation layer 33 having the via 33A is formed on the semiconductor substrate 2.

Figure 10:
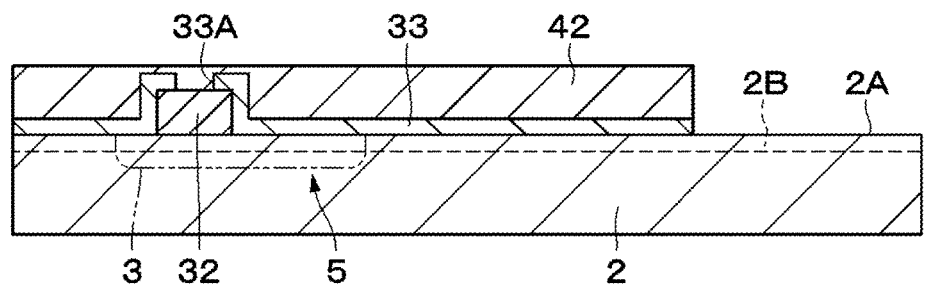
FIG. 10 is a sectional view illustrating an organic layer forming step.

Next, in an organic layer forming step illustrated in FIG. 10, an organic layer 42, which is made of a polyimide resin or the like, is formed on the surface of the insulation layer 33 by applying an appropriate resin material to the surface by spin coating.

Figure 11:
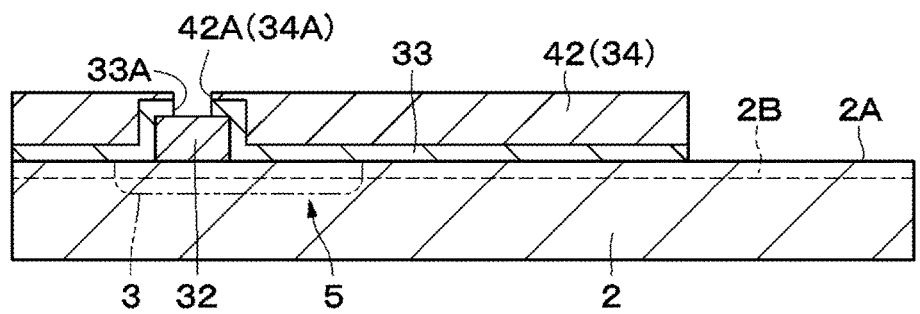
FIG. 11 is a sectional view illustrating a second via forming step.

Subsequently, in a second via forming step illustrated in FIG. 11, for example, holes are formed in the organic layer 42 by using a microfabrication technology, such as a technology using a photoresist. Thus, a via 42A is formed in the organic layer 42 at a position corresponding to the position of the via 33A of the insulation layer 33. As a result, the organic layer 34 is formed over the semiconductor substrate 2 so as to cover the insulation layer 33. The organic layer 34 may be formed by using a photosensitive resin material. In this case, it is possible to form the via 34A in the organic layer 34 by irradiating the photosensitive resin material with ultraviolet rays or the like.

Figure 12:
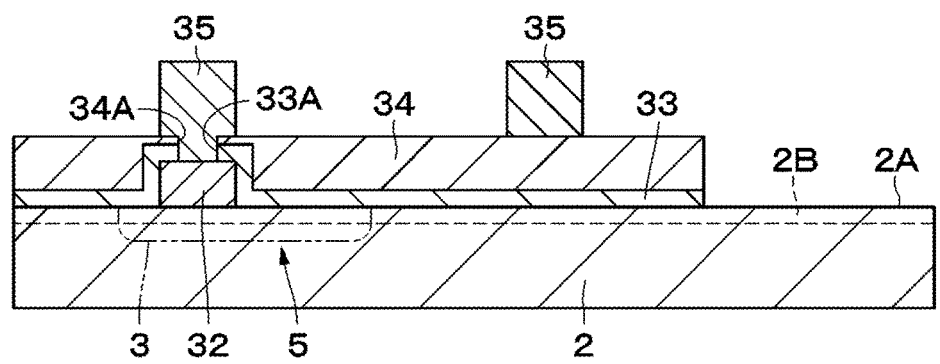
FIG. 12 is a sectional view illustrating a second metal layer forming step.

Next, in a second metal layer forming step illustrated FIG. 12, a metal film of an electrically conductive metal material is formed on the surface of the organic layer 34 by using a film forming method such as vacuum deposition, sputtering, or plating. Subsequently, unnecessary parts of the metal film are removed from the metal film by etching or the like. Thus, the second metal layer 35, which functions as external connection wiring and the like, is formed on the surface of the organic layer 34.

Next, in a passivation film forming step, the passivation film 36, which includes the first insulation film 37 and the second insulation film 38, is formed on or over the surface 2A of the semiconductor substrate 2 by using a film forming method such as plasma CVD. The passivation film 36 is formed on or over the surface 2A of the semiconductor substrate 2 so as to cover the organic layer 34, the second metal layer 35, and the like. In this step, the first insulation film 37 which generates compressive stress and has low density, and the second insulation film 38 which generates compressive stress and has high density, are grown so as to be alternately stacked. The details of the passivation film forming step are substantially the same as those of the passivation film forming step according to the first embodiment. Through the process described above, the semiconductor device 31 illustrated in FIGS. 5 and 6 is formed.

Thus, the second embodiment has substantially the same advantageous effects as the first embodiment. In the second embodiment, the passivation film 36 is formed on or over the semiconductor substrate 2 so as to cover the semiconductor layer 2B, the first metal layer 32, the insulation layer 33, the organic layer 34, and the second metal layer 35. Therefore, even when the semiconductor layer 2B, the insulation layer 33, the organic layer 34, and the metal layers 32 and 35 generate compressive stresses due to the differences in the thermal expansion coefficient therebetween, the first insulation film 37, having low density, can alleviate the compressive stresses.

The metal layers 32 and 35 are formed by vapor deposition or plating. Therefore, compressive stresses tend to be generated in the metal layers 32 and 35 while the metal layers 32 and 35 are being formed. However, since the passivation film 36 is formed so as to cover the metal layers 32 and 35, the passivation film 36 generating tensile stress can alleviate the compressive stresses of the metal layers 32 and 35.

In the embodiments described above, the semiconductor devices 1 and 31 are used, for example, as electric power amplifiers. However, this it not a limitation on the present disclosure. A semiconductor device according to an embodiment of the present disclosure may be used as a passive element such as a solar cell, a light-emitting element such as a laser diode (LD) or a light emitting diode (LED), or an optical sensor including both of a light-receiving element and a light-emitting element.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
   a semiconductor substrate;
   a semiconductor element provided in or on the semiconductor substrate; and
   a passivation film protecting the semiconductor element,
   wherein the passivation film comprising one or more first insulation films and one or more second insulation films, the first insulation films and second insulation films are alternately stacked to each other, each of the first insulation films generates compressive stress and has lower density and each of the second insulation films generates compressive stress and has higher density, and
   wherein one of the first insulation films is disposed as a lowest layer of the passivation film, the lowest layer being nearest to the semiconductor substrate,
   the semiconductor device further comprising a semiconductor layer, an insulation layer, an organic layer, and a metal layer provided on or over the semiconductor substrate, and wherein the passivation film covers the semiconductor layer, the insulation layer, the organic layer, and the metal layer.

2. The semiconductor device according to claim 1, wherein each of the first insulation films and the second insulation films is one of a silicon nitride film, a silicon oxide film, and a silicon oxynitride film.

3. A method of manufacturing a semiconductor device, the method comprising:
   a step of forming a passivation film on or over a semiconductor substrate by alternately stacking one or more first insulation films and one or more second insulation films, each of the first insulation films generates compressive stress and has lower density and each of the second insulation films generates compressive stress and has higher density,
   wherein, in the step of forming the passivation film, the first insulation film is disposed in a lowest layer of the passivation film, the lowest layer being nearest to the semiconductor sub state,
   the method further comprising:
   a step of forming a semiconductor layer, an insulation layer, an organic layer, and a metal layer on or over the semiconductor substrate, the step being performed before the step of forming the passivation film, wherein, in the step of forming the passivation film, the passivation film covers the semiconductor layer, the insulation layer, the organic layer, and the metal layer.

4. The method according to claim 3, wherein the metal layer is formed by vapor deposition or plating.

* * * * *